US009227834B2

United States Patent
Gluche et al.

(10) Patent No.: US 9,227,834 B2
(45) Date of Patent: Jan. 5, 2016

(54) EDGE-REINFORCED MICROMECHANICAL COMPONENT

(75) Inventors: Peter Gluche, Bellenberg (DE); Ralph Gretzschel, Neu-Ulm/Offenhausen (DE); Matthias Wiora, Blaustein (DE)

(73) Assignees: Diamaze Microtechnology S.A. (CH); GFD Gesellschaft für Diamantprodukte mbH (DE)

( * ) Notice: Subject to any disclaimer, the term of this patent is extended or adjusted under 35 U.S.C. 154(b) by 0 days.

(21) Appl. No.: 13/445,519

(22) Filed: Apr. 12, 2012

(65) Prior Publication Data

US 2012/0263909 A1   Oct. 18, 2012

(30) Foreign Application Priority Data

Apr. 12, 2011   (EP) .................................... 11003088

(51) Int. Cl.
| | |
|---|---|
| B32B 3/08 | (2006.01) |
| B32B 9/04 | (2006.01) |
| B44C 1/22 | (2006.01) |
| B81B 3/00 | (2006.01) |
| B81C 1/00 | (2006.01) |
| G04B 1/14 | (2006.01) |
| G04B 13/02 | (2006.01) |
| G04B 15/14 | (2006.01) |
| G04B 17/06 | (2006.01) |
| G04B 31/004 | (2006.01) |

(52) U.S. Cl.
CPC ........... *B81B 3/0075* (2013.01); *B81C 1/00674* (2013.01); *G04B 1/145* (2013.01); *G04B 13/02* (2013.01); *G04B 15/14* (2013.01); *G04B 17/063* (2013.01); *G04B 17/066* (2013.01); *G04B 31/004* (2013.01); *Y10T 428/239* (2015.01); *Y10T 428/24793* (2015.01)

(58) Field of Classification Search
None
See application file for complete search history.

(56) References Cited

U.S. PATENT DOCUMENTS

| | | | | |
|---|---|---|---|---|
| 3,661,526 A | * | 5/1972 | Angus et al. | 117/64 |
| 5,082,359 A | * | 1/1992 | Kirkpatrick | 428/408 |
| 5,317,938 A | * | 6/1994 | de Juan et al. | 76/104.1 |
| 5,366,556 A | * | 11/1994 | Prince et al. | 118/722 |

(Continued)

FOREIGN PATENT DOCUMENTS

| | | |
|---|---|---|
| DE | 102004052068 A1 | 4/2006 |
| DE | 102008041778 A1 | 3/2009 |

(Continued)

OTHER PUBLICATIONS

Floeter, A.; Gretzschel, R.; Von Gunten, S.; Gluche, P.; "Micromechanical Component with Reduced Wear". (Machine Translation of EP2236455 A1); Oct. 6, 2010; EPO.*

(Continued)

*Primary Examiner* — David Sample
*Assistant Examiner* — Donald M Flores, Jr.
(74) *Attorney, Agent, or Firm* — Schwegman Lundberg & Woessner, P.A.

(57) ABSTRACT

The present subject matter relates to a micromechanical component having a top face and a bottom face and at least two side faces, and a coating of diamond and/or diamond-like carbon (DLC) which encompasses all the surfaces of the component, wherein on at least one side face, across at least a part of said side face, the coating has a smaller coating thickness than that of the top face and/or bottom face, so that a reinforced area in reference to the at least one side face is produced.

16 Claims, 13 Drawing Sheets

(56) References Cited

U.S. PATENT DOCUMENTS

| | | | |
|---|---|---|---|
| 5,508,071 A | * | 4/1996 | Banholzer et al. ............ 428/34.4 |
| 5,571,616 A | * | 11/1996 | Phillips et al. ................. 428/336 |
| 6,769,969 B1 | * | 8/2004 | Duescher ........................ 451/59 |
| 2002/0191493 A1 | * | 12/2002 | Hara .............................. 368/140 |
| 2007/0119631 A1 | * | 5/2007 | Eyre et al. ...................... 175/374 |
| 2007/0235230 A1 | * | 10/2007 | Cuillier et al. ................. 175/428 |
| 2010/0006540 A1 | * | 1/2010 | Dinger et al. ................... 216/41 |
| 2010/0047519 A1 | * | 2/2010 | Lee et al. ....................... 428/141 |
| 2010/0068529 A1 | * | 3/2010 | Asplund et al. ............... 428/412 |
| 2011/0292770 A1 | * | 12/2011 | Damasko ....................... 368/175 |

FOREIGN PATENT DOCUMENTS

| | | | |
|---|---|---|---|
| DE | 102008061182 A1 | | 6/2010 |
| EP | 2 236 455 A8 | | 10/2010 |
| EP | 2236455 | * | 10/2010 |

OTHER PUBLICATIONS

"European Application No. 11003088.9-1528, European Search Report dated Oct. 17, 2011", 6 pgs.

Danzer, R., et al., "Technische keramische Werkstoffe [with English translation of Introduction]", Jochen Kriegesmann (Ed.), Technische keramische Werkstoffe, HvB Verlag GbR, Ellerau, ISBN 978-3-938595-00-8, Chapter 6.2.3.1—"The ball on three balls test for determining the biaxial bending strength of brittle materials", (Nov. 2009), 47 pgs.

Morrell, R., et al., "Meso-scale mechanical testing methods for diamond composite materials", Int. Journal of Refractory Metals & Hard Materials 28 (2010) 508-515.

* cited by examiner

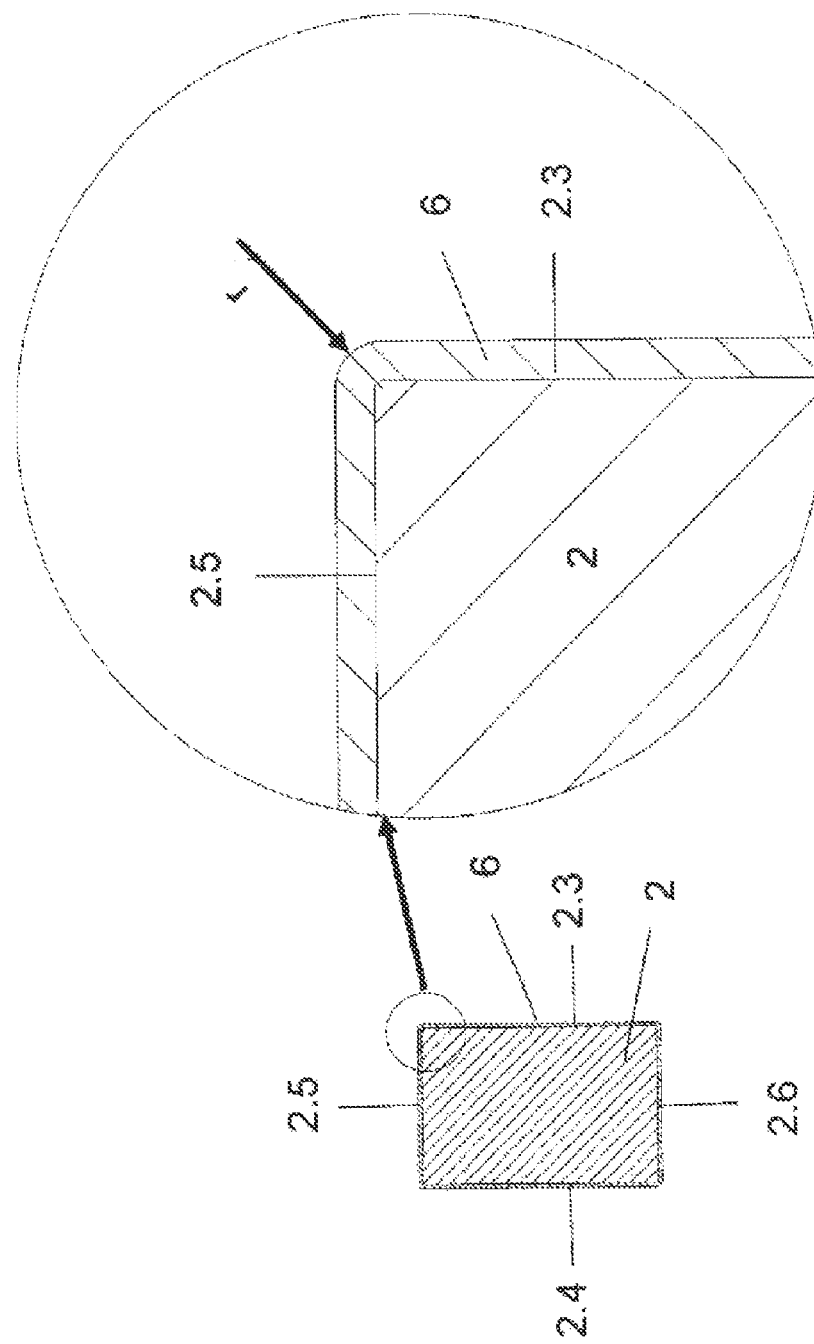

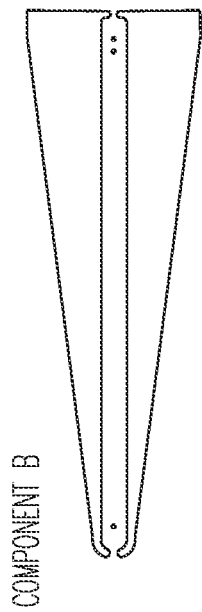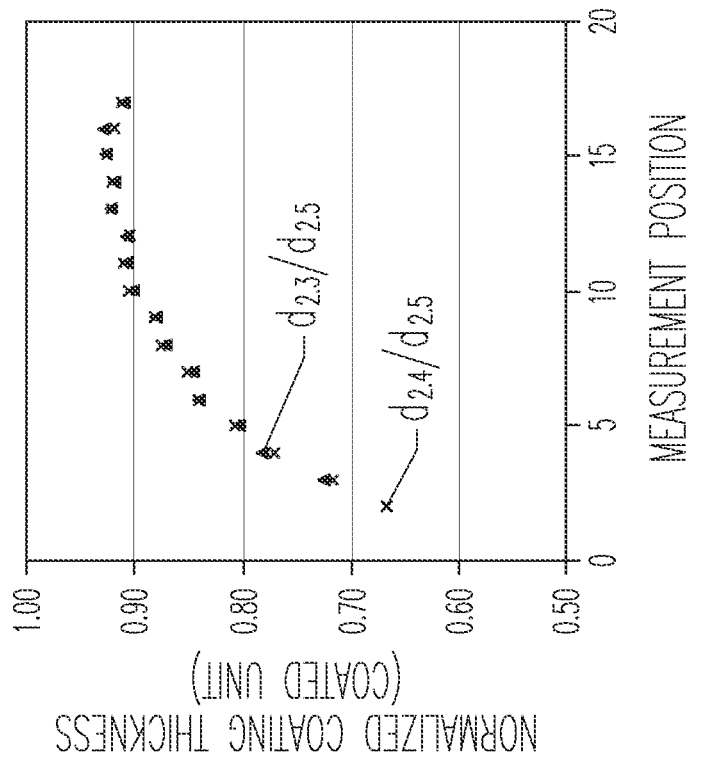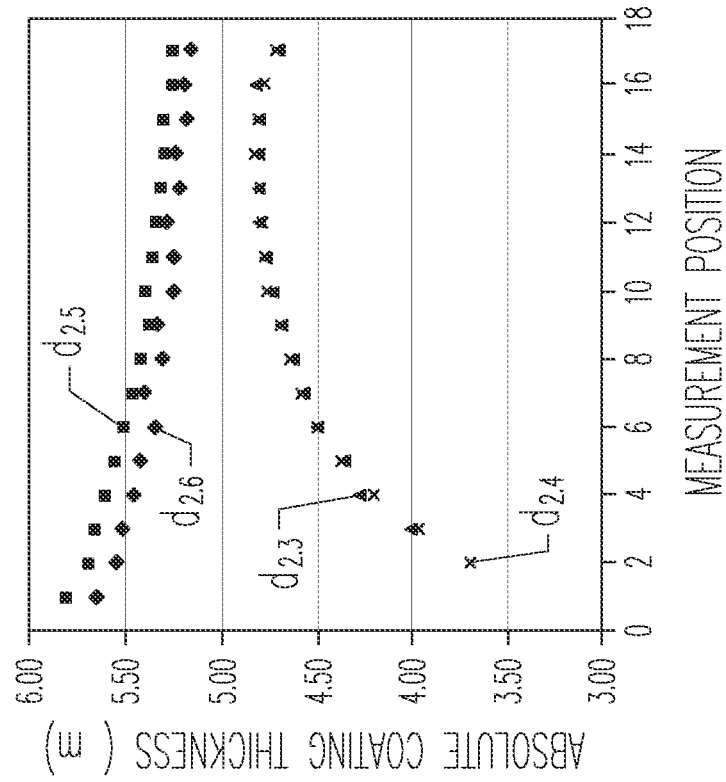
Fig. 4

EDGE-REINFORCED MICROMECHANICAL COMPONENT

CLAIM OF PRIORITY

This application claims the benefit of priority, under 35 U.S.C. §119 (a)-(d) of European Patent Application Serial No. 11 003 088.9-1528, entitled "EDGE-REINFORCED MICROMECHANICAL COMPONENT," filed on Apr. 12, 2011, the benefit of priority of which is claimed hereby, and which is incorporated by reference herein in its entirety.

BACKGROUND

Composite materials consisting of a substrate and diamond are known in the art. For instance, the German laid-open application DE 10 2004 052 068 A1 describes a cutting tool and a method for producing said tool, in which a coating made of diamond is applied to a substrate, which is metallic, for example. Also known in the prior art are micromechanical components which consist of a substrate, with the entire surface of said substrate being covered with a coating of diamond and/or of DLC. For instance, DE 10 2008 041 778 A1 describes a helical tension spring for a barrel of a clock mechanism, wherein this helical tension spring consists of a substrate, such as silicon, for example, and in that said substrate is clad over its entire surface with a coating of diamond and/or DLC.

With the micromechanical components known thus far in the prior art, in other words, also in the case of the helical tension spring according to DE 10 2008 041 778 A1, the substrate, which is embodied as rectangular in cross-section according to the above-cited laid-open application, has applied to it a diamond coating, which fully covers the entire surface of the substrate and which has the same thickness over all of its surfaces.

With the components described in the prior art, the superior physical properties of diamond, such as its extremely high hardness and good sliding friction properties, are particularly utilized.

The disadvantage of these known micromechanical components, however, is that the component cannot be optimally adapted to its specific application or load case, because in the case of the helical tension spring, for example, the forces acting on the helical tension spring are not constant over the entire length of the spring, and therefore, optimal gear behavior cannot thereby be achieved. The same is true of other components that are equipped with a diamond coating and are in contact with other components, because the forces in these cases act only at localized areas, e.g., at the contact points. This applies to escapements and escapement wheels, for example, but also to all gearworks and bearing components.

In light of the above, therefore, the problem addressed by the present subject matter is that of proposing micromechanical components which are embodied such that they can be optimally adapted to their specific intended use with respect to their required physical and mechanical properties, i.e., to their specific mechanical load case. At the same time, the micromechanical component should be cost-effectively producible. In the case of clock components, the component should also be lightweight (low mass or low moment of inertia) and any complex geometric shape should be possible.

OVERVIEW

These problems can be solved with respect to the micromechanical component by the features of claim 1 and with respect to the production method by the features of claim 11. The dependent claims specify advantageous further developments.

The present subject matter relates to a micromechanical component, which consists of a substrate having a top face and a bottom face and at least two side faces, and a coating that encompasses the substrate, wherein the coating is made of diamond and/or diamond-like carbon. A micromechanical component can include a coating made of diamond and/or diamond-like carbon has a thinner coating thickness on at least one side face of the micromechanical component than on the top face and/or bottom face of the component, so that a reinforced area is created.

According to the present subject matter, it is therefore proposed to provide a micromechanical component having a top face and a bottom face and comprising a substrate having at least two side faces with a coating of diamond and/or diamond-like carbon (DLC), which encompasses all the surfaces of the substrate resulting in a three-dimensional coating. A key aspect of the teaching according to the present subject matter is that the coating of diamond and/or of DLC is embodied such that on at least one side face of the component, it has a thinner coating thickness over at least a part of this side face than on the top face and/or bottom face, so that on the at least one side face, the coating thickness varies. This results in reinforced localized areas on at least one of these side faces. As a result, therefore, the coating is modulated on the at least one side face.

The diamond coating that is used on the component according to the present subject matter is preferably a microcrystalline and/or nanocrystalline diamond coating. Advantageous average grain sizes range from 5 to 100 nm, most particularly preferably from 1 to 10 nm. According to the present subject matter, nanocrystalline diamond is understood as a diamond coating wherein the crystalline domains have an average grain size $d_{50}$ of ≤100 nm. This definition specifies that with at least 50% of the crystallites, each dimension of an individual crystallite is 500 nm. The nanocrystalline diamond coating is therefore characterized, in contrast to polycrystalline diamond coatings, by an extremely high homogeneity of the crystallites.

It is further preferable for the gradient of the average grain size of the nanocrystalline diamond, measured in the direction of the thickness of the nanocrystalline diamond coating, to be <300%, preferably <100%, particularly preferably <50%. This embodiment provides that the average grain diameter of the nanocrystalline domains of the diamond coating is distributed relatively uniformly to particularly uniformly throughout the entire coating thickness, i.e., the grain sizes on one side of the diamond coating are approximately the same size as on the other side of the diamond coating; of course, a nearly or fully complete homogeneity of the nanocrystalline domains of the diamond coating is particularly advantageous. The gradient is determined by determining the average grain diameter $d_{50}$ on one side of the diamond coating, and then relating this to the average grain diameter on the opposite side of the diamond coating. The average grain size distribution on the surface of the respective diamond coating can be taken into consideration in this, for example.

A further embodiment provides that the ratio of sp-bonds and $sp^2$ bonds in the finely crystalline diamond coating lies between 0.5 and 10%, preferably between 2 and 9%, particularly preferably between 3 and 8%.

An embodiment of the present subject matter provides that a layer of adhesion promoter, preferably comprising silicon carbide, wolfram, titanium or silicon, is optionally applied or formed in-situ between the substrate and the finely crystalline diamond coating. This embodiment ensures good adhesion of the diamond coating to the substrate.

According to the present subject matter, it is further advantageous for the crystallites of the finely crystalline diamond coating to be grown preferably in the <100> direction, the <110> direction and/or the <111> direction, i.e., for a texture to be present. This can result from the manufacturing process, in which the growth rate of certain crystal directions can be specifically selected. This anisotropic texture of the crystallites also positively influences the mechanical properties.

Because one problem addressed by the present subject matter is that of increasing the mechanical stability of the component in localized areas, the use of diamond coatings having grain sizes within this range results in several advantages:

Decrease in Susceptibility to Fracturing

In contrast to polycrystalline diamond coatings, the individual grains in the case of nanocrystalline diamond coatings as described above are very small. A grain boundary, which generally represents a weak point in the material, therefore also has very small dimensions, particularly when the ratio of the grain boundary extension to the coating thickness of the diamond coating is considered. In contrast to polycrystalline diamond, in which the particle boundaries extend primarily in a columnar fashion throughout the entire coating, the grain boundary in the nanocrystalline diamond no longer represents a microscopic predetermined fracture point, and the macroscopically determined bending fracture stresses $\sigma_0$ of such nanocrystalline diamond coatings are therefore very high as compared with those of polycrystalline diamond coatings. Typical values are >2 GPa, preferably >4 GPa, and particularly preferably >5 Pa.

Regarding the definition of bending fracture stress, reference is made to the following passages in the literature:

R. Morrell et al., Int. Journal of Refractory Metals & Hard Materials, 28 (2010), pp. 508-515, incorporated herein by reference in its entirety; and R. Danzer et al., in "Technische keramische Werkstoffe", published by J. Kriegesmann, HvB Verlag, Ellerau, ISBN 978-3-938595-00-8, chapter 6.2.3.1—The ball on three balls test for determining the biaxial bending strength of brittle materials", incorporated herein by reference in its entirety.

In this, bending fracture stress is determined by statistical analysis of fracture tests, e.g., in the B3B stress test according to the literature citations listed above. It is thus defined as the fracture stress at which a fracture probability of 63% is present.

Better Adhesion (Delamination Prevention) by Adapting Bending Strength to the Substrate The use of nanocrystalline diamond coatings having grain sizes as indicated above also results in an E-modulus that is significantly reduced in relation to that of polycrystalline diamond coatings, so that better adaptation to the E-modulus of the substrate is ensured. For instance, most polycrystalline diamond coatings have an E-modulus of >1000 GPa. Typical substrate materials, such as silicon or silicon dioxide, for example, have a much lower E-modulus of approximately 100 to 200 GPa. In mechanical load cases, the substantial difference in bending strength between substrate and coating results in heavy stress on the interface, which in the worst case can fail, resulting in a delamination of the diamond coating. This then results in the total failure of the component. For this reason, a matching of the bending strengths of substrate and coating is advantageous. This can also be achieved by reducing the grain size. Because as the grain size of the diamond coating decreases, the grain boundary volume as a percentage of crystal volume (grain volume) increases, and generally weaker bonds are present at the grain boundary than in the crystal (grain), the macroscopically determined E-modulus correlates diametrically to the average grain size. Typical values for the E-modulus of nanocrystalline diamond coatings (grain size approximately 10 nm) lie within a range of <900 GPa, and particularly preferably <700 GPa.

Better Frictional Properties

The use of diamond coatings having mean grain sizes ranging from 5 to 100 nm and particularly preferably ranging from 1 to 10 nm also produces an advantageous effect in terms of surface roughness, since surface roughness also decreases as grain size decreases. The determined coefficient of sliding friction (e.g., determined by a ball-on-disc rotational friction test using a tribometer) of two diamond coatings that are in contact with one another is dependent upon the surface roughness of said coatings. If the microscopically present roughness areas are able to interlock with one another, an increased coefficient of sliding friction is measured macroscopically. This coefficient lies within the range of approximately 0.3. After a certain amount of time, the frictional contact results in a polishing of the surfaces, which in the best case results in an ideally smooth surface. When this state is reached, coefficients of sliding friction of 0.01 to 0.03 are measured. The small grain diameter of nanocrystalline diamond coatings therefore also directly affects the coefficients of sliding friction of the components.

Of course, the surfaces of the diamond coatings can also be reworked mechanically by subsequent polishing, e.g., using mechanical vibratory finishing or drag finishing. Ultrasound-supported finishing in abrasive suspensions composed of diamond particles or ceramic grinding agents, such as $Al_2O_3$ or SiC, etc., for example, plasma polishing in oxygen and/or chlorine-containing and/or fluorine-containing plasmas and/or ion-based processing steps, such as RIE (reactive ion etching), ion milling, or other ion bar-based processes are also possible. In this manner, an advantageous surface roughness of between 1 and 50 rms, particularly advantageously, a surface roughness of <7 nm rms is achieved.

With the modulation according to the present subject matter of the side face and of the nanocrystalline diamond coatings that are used, the properties of the component can be selectively influenced. The micromechanical component according to the present subject matter therefore combines decisive advantages. For instance, the susceptibility to fracturing in the selectively reinforced area is improved significantly over that of non-reinforced areas. Moreover, it is possible to selectively adjust the flexible deformation or bending strength of flexible components by using certain areas that are reinforced. In mechanical clock mechanisms, multiple load cases are present. For instance, restricting components (escapement and escapement wheel) are stressed, for example, by impact and also dynamically by pressure. More particularly, as a result of impact stress, a delamination of the diamond coating can occur. Those areas that are affected by impact stress can be well localized. A specific increase in the coating thickness of the diamond coating in these areas is therefore advantageous. Furthermore, localized reinforcement can also be used advantageously for the assembly of such components. For example, the diamond coating thickness of an axle hole for receiving an axle can be locally reinforced so that the component can be pressed onto the steel axle. This allows costly gluing steps to be eliminated. Ultimately, the specific reinforcement of the diamond coating or of the DLC coating also influences wear and tear properties, so that improvements can also be achieved in this manner, e.g., by selectively increasing the volume wear rate in areas susceptible to particularly high mechanical stresses.

With the component according to the present subject matter, therefore, the location and the type of reinforcement are selected/adjusted specifically according to the intended purpose of said component. For instance, the reinforced area in components that are in contact with another component, have the reinforced area at least on said side face that comes into contact with the other component. With flexible components, in contrast, the reinforced area is selected such that the desired manner and type of deformation are controlled. In this, the reinforced area can have a uniform coating thickness, or the reinforced area has a varying coating thickness. A varying coating thickness is understood to mean that the reinforced area decreases continuously from an initial coating thickness, or also in the form of a specific, predefined curve, to a lower value. It is also obvious from the present subject matter that a stepped embodiment of the coating thickness is possible.

The coating thickness of the coating on the top face or bottom face of the micromechanical component preferably ranges from 0.5 to 50 µm, and particularly preferably ranges from 2 µm to 7 µm. Coating thickness of the coating on the side face can be up to 100% smaller than on the top face or bottom face of the micromechanical component. The coating thickness of the side face can thereby be selectively modulated in localized areas if the coating thickness of the at least one side face is normalized to the top face and/or bottom face, the normalized coating thickness of the side faces, referred to the minimum value, can vary by more than 10%, preferably by more than 20%, particularly preferably by more than 100%. The selection of the coating thickness both in the non-reinforced area and in the reinforced area of the side face is based upon the intended application.

The micromechanical component as described above is a component which is formed from a substrate having at least two side faces and an upper face and a bottom face, wherein the diamond coating or the DLC coating encompasses all the surfaces of all the sides and faces, in the manner of a 3-D coating. The present subject matter also comprises components in which the at least two side faces coincide, resulting in a continuous side face. In cross-section, the micromechanical component is preferably a component that has a quadrangular, preferably a rectangular cross-section. In this case, the component has at least two side faces. Examples of micromechanical components of this type, which have a rectangular cross-section, are particularly components used in assembling clock mechanisms, such as clock mechanism components, for example, chosen from the group consisting of helical tension springs, escapements, escapement wheels, restricting components, plateaus, gears, drive mechanisms, bearing pads, cover pads, journal pins, shafts, axles, springs, helical tension springs, balance springs, and balance wheels. Most particularly preferably, the micromechanical component is a helical tension spring.

With regard to the substrate, the micromechanical component is subject to no restrictions at all. The substrate is preferably chosen from the group consisting of:
a) Semimetals, preferably carbon, silicon or germanium;
b) Metallic materials, preferably Fe, Ni, Cr, Co, Cu, Mn, V, Ti, Sc, W, Ta, Mo, Nb, Pt, Au, Rh;
c) Alloys of the metallic materials listed under b); or
d) Metallic carbides of the refractory metals Ti, Ta, W, Mo, Ni; or
e) Iron-containing materials, such as steel; or
f) Composite materials made of ceramic materials in a metallic matrix (cermets), hard metals, sintered cemented hard carbides, such as cobalt or nickel-bonded wolfram carbides or titanium carbides; or
g) Carbon- and/or nitrogen- and/or boron- and/or oxygen-containing ceramic materials, such as silicon carbide, silicon nitride, boron nitride, titanium nitrides, AN, CrN, TiAlN, TiCN, and/or $TiB_2$, glass ceramics, sapphire;
h) Carbon, such as graphite, monocrystalline diamond, polycrystalline diamond, nanocrystalline diamond.

The present subject matter further comprises embodiments in which an additional sealing layer of $sp^2$-enriched carbon is applied to the coating, particularly to the area of the reinforcement. This can also involve a gradient coating, i.e., a coating which changes beginning with the diamond coating from an $sp^a$-containing coating to an $sp^2$-containing coating. By applying an $sp^2$-containing coating, an electrical conductivity can also be achieved, which counteracts the effects of electrostatic charges.

The present subject matter also further comprises a method for producing a micromechanical component as described in the following.

According to the present subject matter, a substrate is assumed, which is present in substrate form. In the case of silicon as the substrate, a silicon wafer (or SOI, silicon on insulator) can preferably be used as the substrate plate. In this case, the wafer top face and the wafer bottom face later form the top face and bottom face, respectively, of the micromechanical component. The side faces are produced in the following steps: In a next step, the substrate is structured, wherein in this case, the form of the micromechanical component is produced by way of an etching step substantially orthogonally to the surface of the substrate plate. This step can be executed by way of the DRIE (Deep Reactive Ion Etching) method, for example. Wherein, by means of photolithography, areas are first defined which are to be protected from the etching process.

In the case of an SOI substrate, following the above-described execution of the DRIE step of the device layer of the SOI wafer, the substrate is separated from the device layer. This is carried out by a chemical etching of the oxide.

After the wafer has been cleaned, the substrate is nucleated with carbon-containing educts to form diamond seeds, and this is followed by a growth of the diamond coating by means of gas phase deposition, e.g., by a hot filament- or plasma-induced method.

Essential to the present subject matter in this method, therefore, is that the gap width between the released component and the (residual) wafer, resulting from the silicon etching step, is varied accordingly. The quality and rate of the silicon etching process is influenced very strongly by the gap width. For this reason, up to now, based upon the prior art, a constant trench width, in most cases with a small extension, has been used. However, a greater trench width can be achieved structurally by introducing sacrificial structures, without requiring that the optimal trench width for the silicon etching step be changed. Specifically, the inventors have succeeded in demonstrating that a specific relationship exists between the gap width and the thickness of the coating in the formation of the diamond coating. Specifically, when the gap width is enlarged, the coating thickness of the diamond coating or DLC coating formed during growth is also increased. Although the entire wafer with the components contained therein is coated with diamond in a single process step, and no special precautions are required for masking specific areas, the thickness of the coating on the substrate can be variably adjusted solely by using specific structuring and a specific selection of the gap width. The gap width and/or the size of the available substrate surface per surface unit (referred to the perforated wafer surface) specifically influences the penetration of the gaps with reactive species during the coating process, and therefore results in a localized increase or decrease in the growth rate. Very small gap widths lead to a complete halt in growth on the side face and result in an uncoated area on the side face.

Astonishingly, it has also been found that nanocrystalline diamond coatings can be deposited very homogeneously, even with small gap widths. Particularly in the case of high aspect ratios, however, a coating thickness gradient also forms on the side edge or side face, which can lead to a concave coating thickness profile on the side edge. This effect can also be used to advantage in order, for example, to hold the deformation of a helical spring (e.g., helical tension spring or balance spring of a clock mechanism) within a single plane, and thereby avoid an uncontrolled deformation of the spring coils in the axial direction.

In reference to the coating method, the present subject matter of course is not subject to any restrictions, so that in the method according to the present subject matter, a chemical gas phase deposition (CVD) known in the art, preferably hot filament deposition, can be carried out.

BRIEF DESCRIPTION OF THE DRAWINGS

In what follows, the present subject matter will be specified in greater detail in reference to the following figures:

FIG. 1a) shows a cross-section of a rectangular component with a coating according to the prior art.

FIG. 4 shows the same evaluations, but in this case with respect to component b of FIG. 2.

FIG. 7 shows an escapement, which is structured from a wafer and has a uniform coating thickness, whereas

DETAILED DESCRIPTION

The section on the left of FIG. 1a) provides a schematic illustration in cross-section of a rectangular component 2, which is encompassed over its entire surface, i.e., on all sides, both on side faces 2.3 and 2.4, and on top face 2.5 and on bottom face 2.6, by a coating 6. The schematic illustration of FIG. 1a) involves a component of the prior art, i.e., a component in which a coating 6 is provided in the form of a 3-D coating, around side faces 2.3 and 2.4, around top face 2.5 and around bottom face 2.6. Because in the prior art thus far, small, constant gap widths have been used, the coating thickness on face 2.3 is somewhat smaller than on the top face 2.5. In the right section of FIG. 1a), the embodiment of the corner is shown in an enlarged illustration. As is clear from the section on the right of FIG. 1a), the coating 6 of the component 2 at the edge region, i.e., where the side face 2.3 meets the top face 2.5, a rounded area is produced. In the right section, this is indicated by the arrow and r, i.e., for the radius of this rounded area.

Figure 1B:
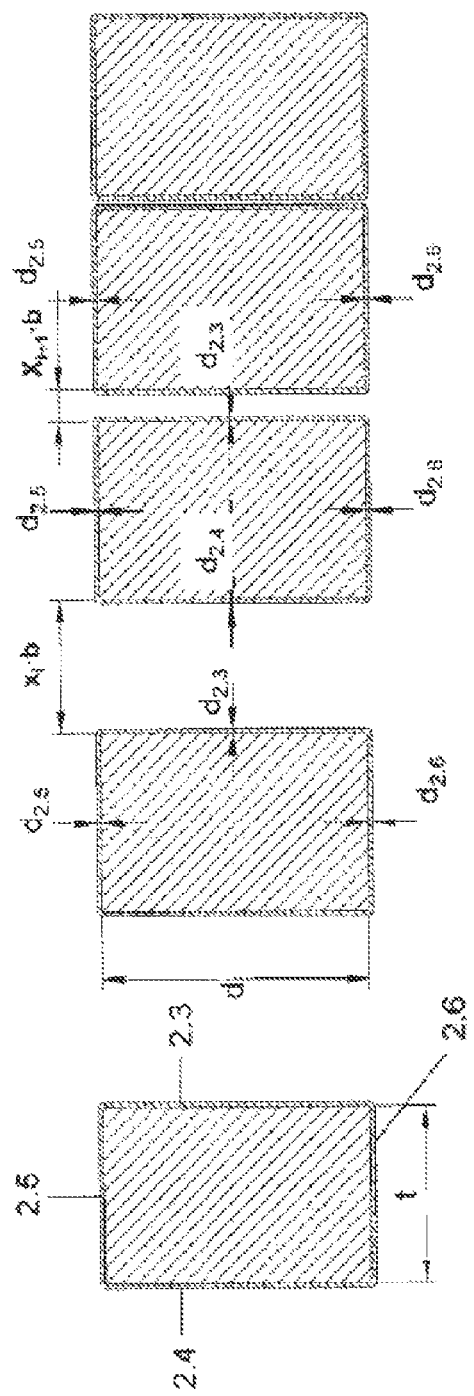
FIG. 1b) also shows a rectangular component, but with a coating according to the present subject matter.
Figure 5:
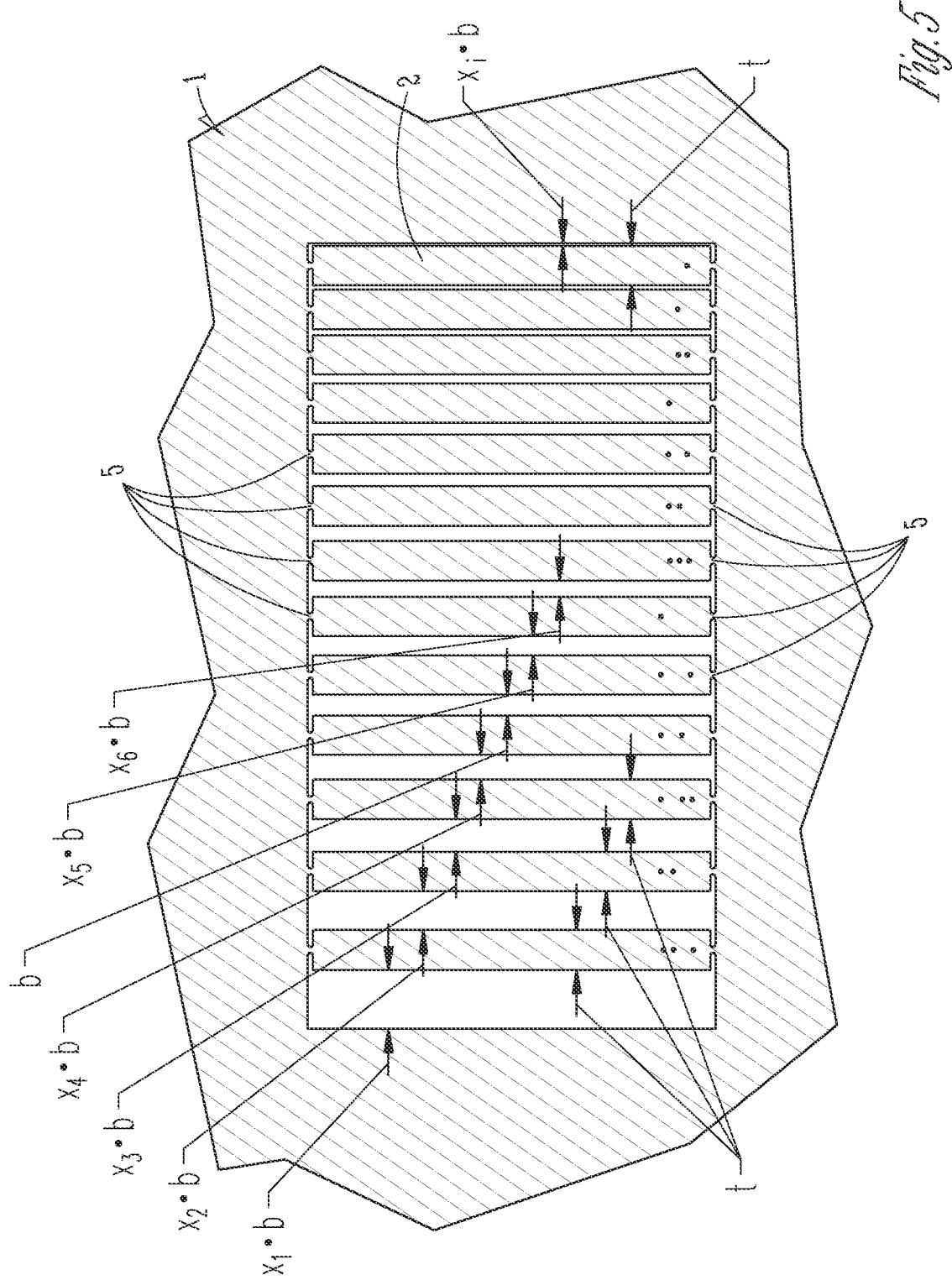
FIG. 5 shows a plan view of a wafer with a structured rectangular component and various gap widths, as is already schematically illustrated in FIG. 1c).

FIG. 1b) illustrates schematically how, by varying the gap width, different coating thicknesses can be achieved, e.g., on side faces 2.3 and 2.4. The first gap width is identified as $x_1b$, and t is used to identify the width of the component. The additional gap widths are then determined using $x_2$, $x_3$ and $x_4$. Reference is also made here to FIG. 5, which shows a similar arrangement in which the individual components 2 are structured in a substrate 1.

With a structure as illustrated in FIG. 1b), the general correlation between coating thickness and gap width has been determined. This is illustrated in FIG. 1c).

Figure 1C:
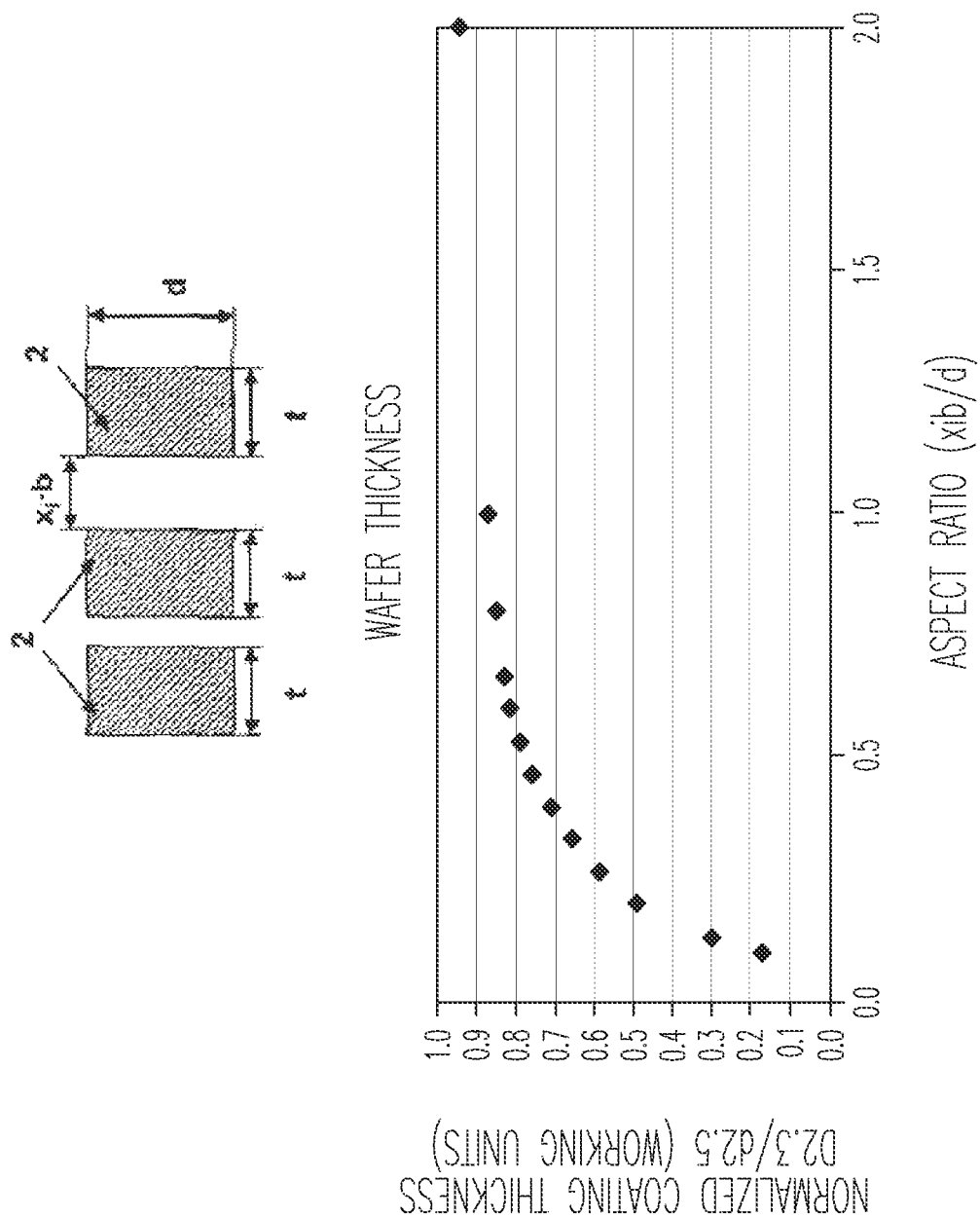
FIG. 1c), various gap widths for generating different coating thicknesses of a rectangular component are schematically illustrated.

In FIG. 1c), the aspect ratio is depicted on the horizontal axis, i.e., the ratio of gap width b to wafer thickness d. The vertical axis depicts the normalized coating thickness. The normalized coating thickness according to the present subject matter is understood as the coating thickness which is referred to the coating thickness of the top face and/or the bottom face. The individual measured values are therefore obtained by dividing the coating thickness of the top face, e.g., 2.5, by the coating thickness of a side face, e.g., side face 2.3. Accordingly, in the ideal case, when the coating thickness on the side face, e.g., 2.3, has the same thickness as the coating on the top face or on the bottom face, this results in a normalized coating thickness of 1.

For a structuring as illustrated in FIG. 1b), FIG. 1c) then shows that the aspect ratio is dependent upon the normalized coating thickness. Using this correlation, the thickness ratios on side faces 2.3 and/or 2.4 can then be very selectively adjusted.

Figure 1D:
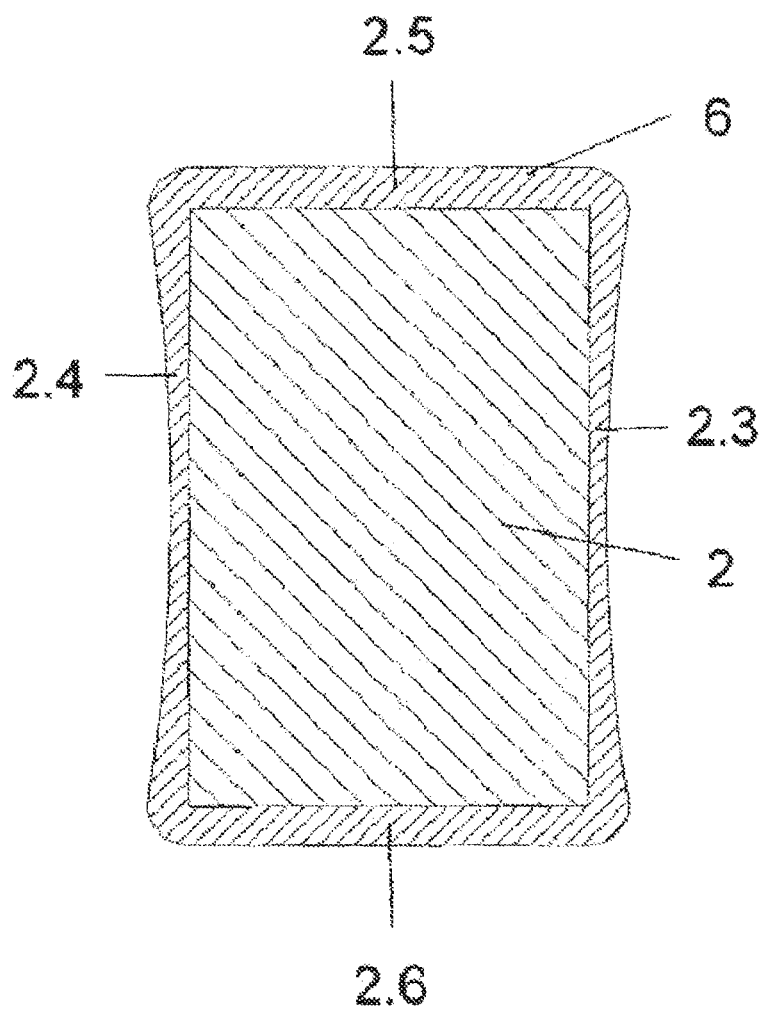
FIG. 1d) illustrates graphically how the normalized coating thickness changes with the geometry of the gap width.

FIG. 1d) shows a component 2 according to the present subject matter, also in cross-section, which again is rectangular in cross-section and has the side faces 2.3, 2.4, a top face 2.5, and a bottom face 2.6. The inventors established that a coating of this type having a slightly concave side face coating 2.3 and 2.4 can also be achieved when working with a gap of constant gap width, but in this case with the stipulation that very small gap widths are used. Coatings such as the one illustrated in FIG. 1d) are obtained when a ratio of gap width b to wafer thickness d of at least 1:5 is maintained.

The inventors have further succeeded in demonstrating that when a very large gap, specifically a gap that corresponds to at least 2d, is realized, a saturation is present in the coating, i.e., when gap widths of this type which go beyond 2d are realized, no further appreciable increase in thickness is achieved.

Figure 2:
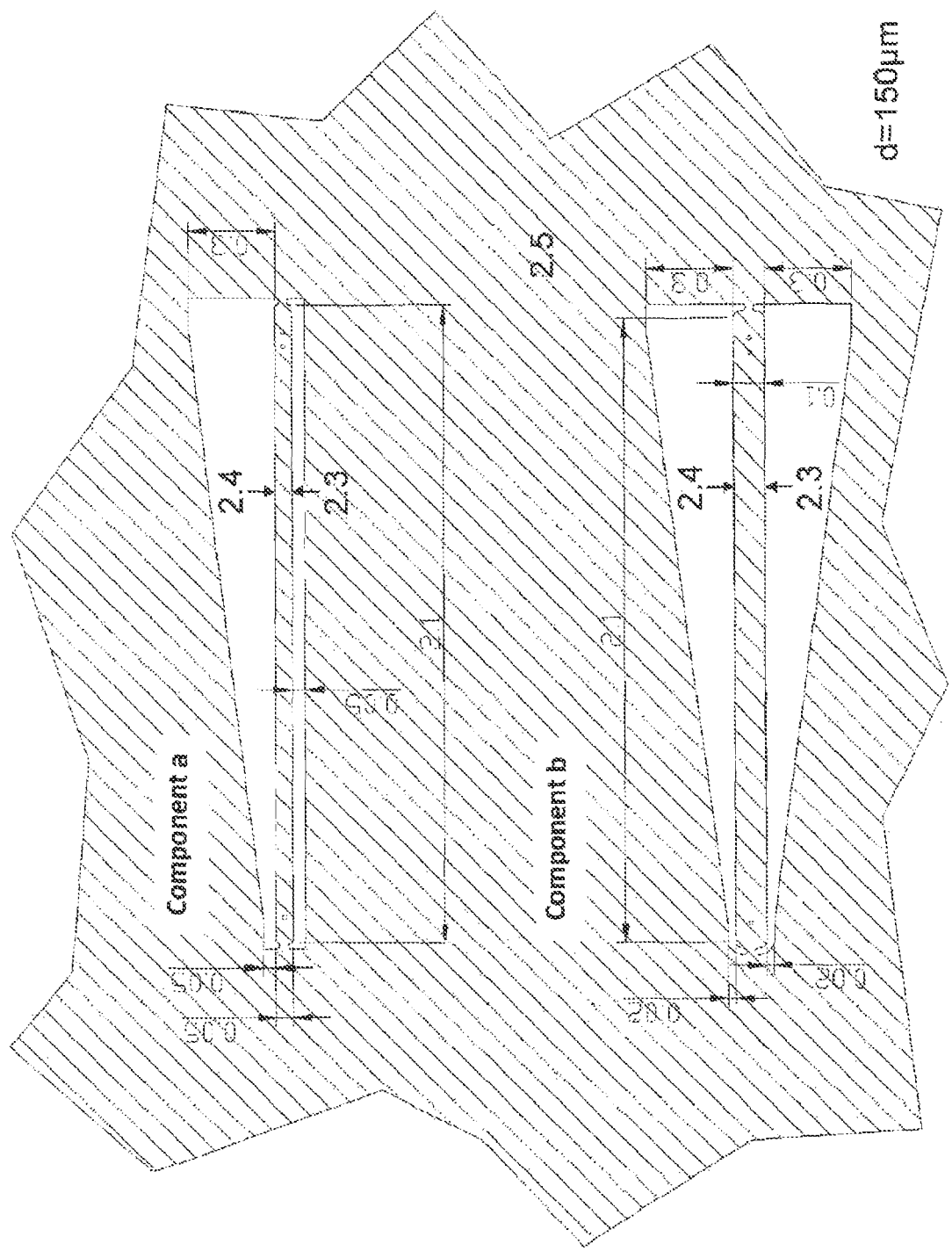
FIG. 2 shows a substrate with two components according to the present subject matter, specifically one component a and one component b having varying gap widths.

FIG. 2 shows a further example of how the components according to the present subject matter can be selectively influenced by structuring.

FIG. 2 shows a silicon wafer, the top face of which is identified as 2.5. As is clear from FIG. 2, two components, specifically one component a and one component b, have been structured in the silicon wafer. The thickness d of the wafer is 150 μm. In the concrete example according to FIG. 2, both for the component a and for the component b, the bar length is 2.1 mm. In this, component a has been structured such that on the side face 2.3, a constant gap having a gap width of 0.05 mm has been realized, wherein on the opposite side 2.4, a widening gap extends starting from a gap width of 0.05 mm and widening up to 0.3 mm.

Component b, in contrast, has been symmetrically structured, i.e., there are two widening gaps on both sides, as has already been described for side face 2.4 of component a. In the case of component b, the gap widens from 0.02 mm again up to 0.3 mm, and on the side face 2.3 the gap widens in a similar manner. The thickness t of the component is 0.1 mm.

Figure 3:
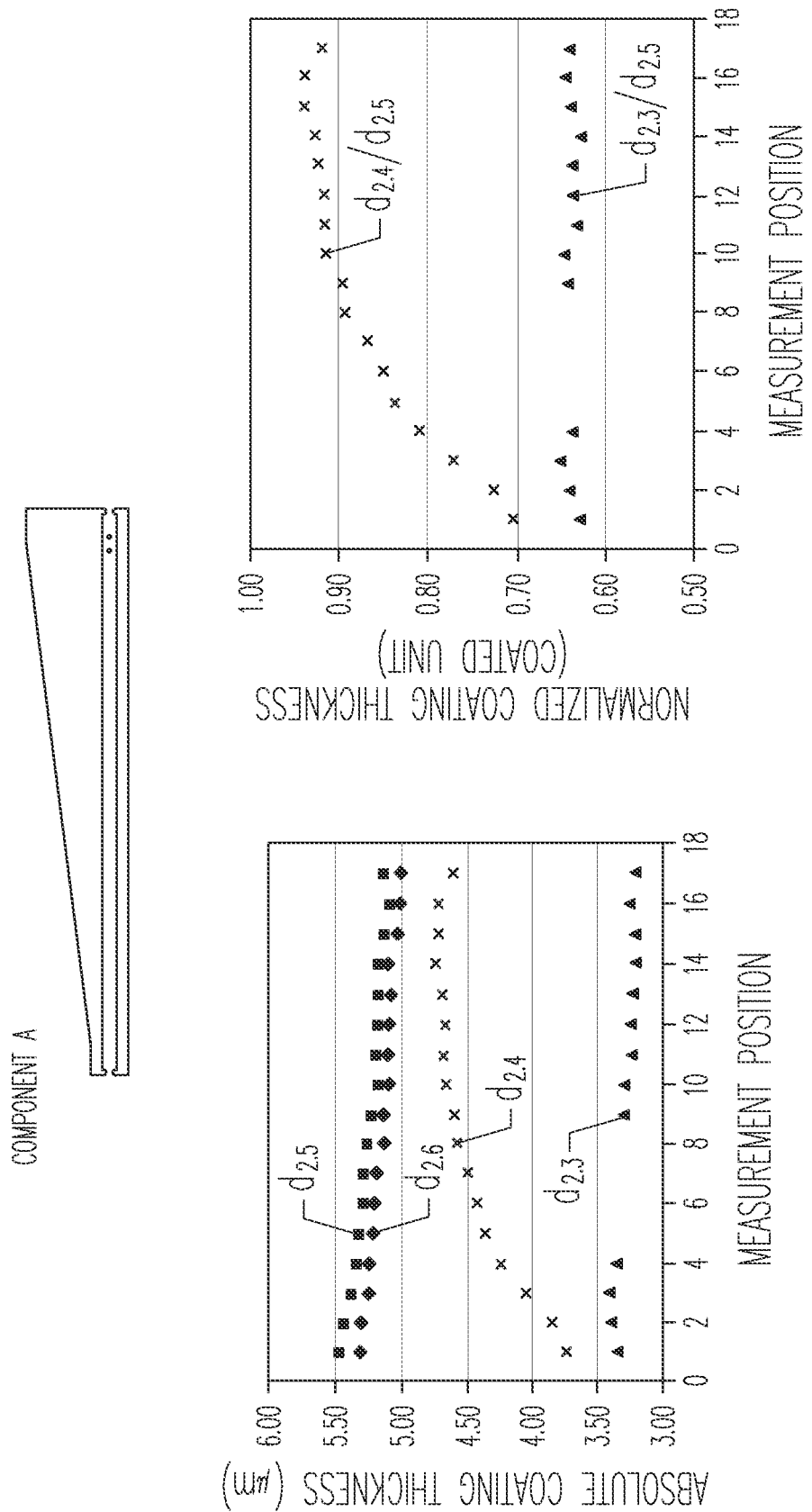
FIG. 3 shows the evaluation of component a in the form of two graphic diagrams referred to the absolute coating thickness and the normalized coating thickness.

FIG. 3 illustrates the absolute coating thicknesses and the normalized coating thicknesses for component a, and FIG. 4 shows the same measurement results for component b.

In FIG. 3, component a is again illustrated schematically, in the same manner as in FIG. 2.

The left graphic contains the measurement results, those on the vertical axis indicating the absolute coating thicknesses in μm, and those on the horizontal axis indicating the number of measurement positions. With a bar length of 2.1 mm, 19 equidistant length segments from left to right were defined, and were then used as measurement points. In each case, the first and last measurement points at the beginning of the bar and the end of the bar have not been recorded for metrological reasons. In other words, the first measurement value was taken 110 μm after the end of the bar, and the last measurement value was taken 110 μm before the end of the bar.

In the graphic on the left, the absolute coating thicknesses are shown for the individual measurement positions as described above. As is clear from the graphic, therefore, for component a, an absolute coating thickness of the coating on the side face 2.3, i.e., on the side face for which a constant gap was present, of approximately 3.4 μm results. The coating thicknesses on the respective top and bottom faces, which have also been illustrated and specifically identified in the graphic, are nearly constant and vary within the range of 5.0 μm and 5.5 μm. As is clear from the left section of FIG. 3, a gradually increasing coating thickness results on side face 2.4 of component a. The same correlation has already been described in reference to FIG. 1d).

In the graphic on the right, in turn, the individual measurement points are depicted on the horizontal axis and the normalized coating thickness is plotted on the vertical axis. This results in a nearly straight line for the normalized coating thickness for side face 2.3, for which a constant gap has been selected, whereas for side face 2.4, a normalized coating thickness ($d_{2.4}/d_{2.5}$) results, which changes in the manner indicated.

With the discovered correlations between gap width and coating thickness, components according to the present subject matter can now be constructed, which have corresponding coating thickness changes at very specific locations, and therefore, the properties of the components can thereby be very selectively influenced.

In FIG. 4, the same measurement results are illustrated, in this case for component b. As is clear from this figure, a normalized coating thickness, which increases continuously from 0.65 to 0.92 mm, results in a symmetrically structured component.

FIG. 5 shows, by way of example in the form of a silicon wafer 1, which serves as the substrate, how corresponding gap widths can be produced by structuring. The first gap width for the first micromechanical component is identified as $x_1$b, and again, as was already described in reference to FIG. 1c), t is used to identify the width of the component. The additional gap widths are then determined using $x_2$, $x_3$ and $x_4$. The individual micromechanical components are held in the substrate 1 by lands 5. With the help of such a structure, the general correlation between coating thickness and gap width (FIG. 1d)) was determined.

FIG. 5 illustrates effectively that in a very simple manner, using the discovered correlation between aspect ratio and coating thickness as depicted in FIG. 1d), different coating thicknesses can be very selectively realized on the side faces of the components according to the present subject matter. Thereby, for the first time, a method is available for selectively influencing coating thicknesses and therefore reinforced areas on the side faces of micromechanical components. At this point it should also be emphasized that because this reinforcement can be applied selectively to individual areas of the side faces, a clear cost advantage is also realized. The micromechanical component according to the present subject matter is therefore characterized not only by the fact that the selectively reinforced areas of diamond or DLC result in improved performance properties, but also by the fact that at the same time, as a result of a low material consumption and a thin embodiment of the diamond coatings at the sites not located in the functional area, major cost advantages can be achieved.

Figure 6:
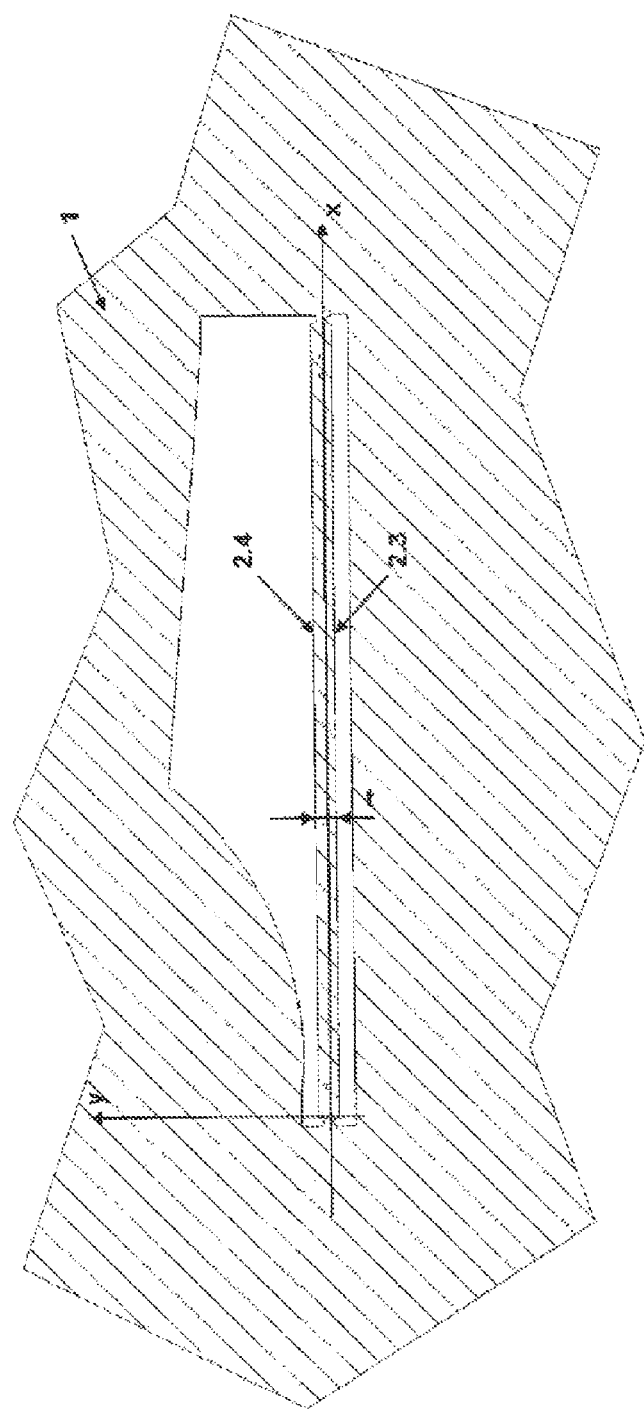
FIG. 6 shows an additional embodiment, in which the gap width changes continuously.

FIG. 6 shows a further possibility in which again on the one side face 2.3, a constant normalized coating thickness has been realized, and on the other side face 2.4, in the right section a coating thickness that slopes downward monotonically, and in the left section a coating thickness that decreases along a specific predefined curve to the "target coating thickness" by the formation of a corresponding gap is selected.

Figure 7:
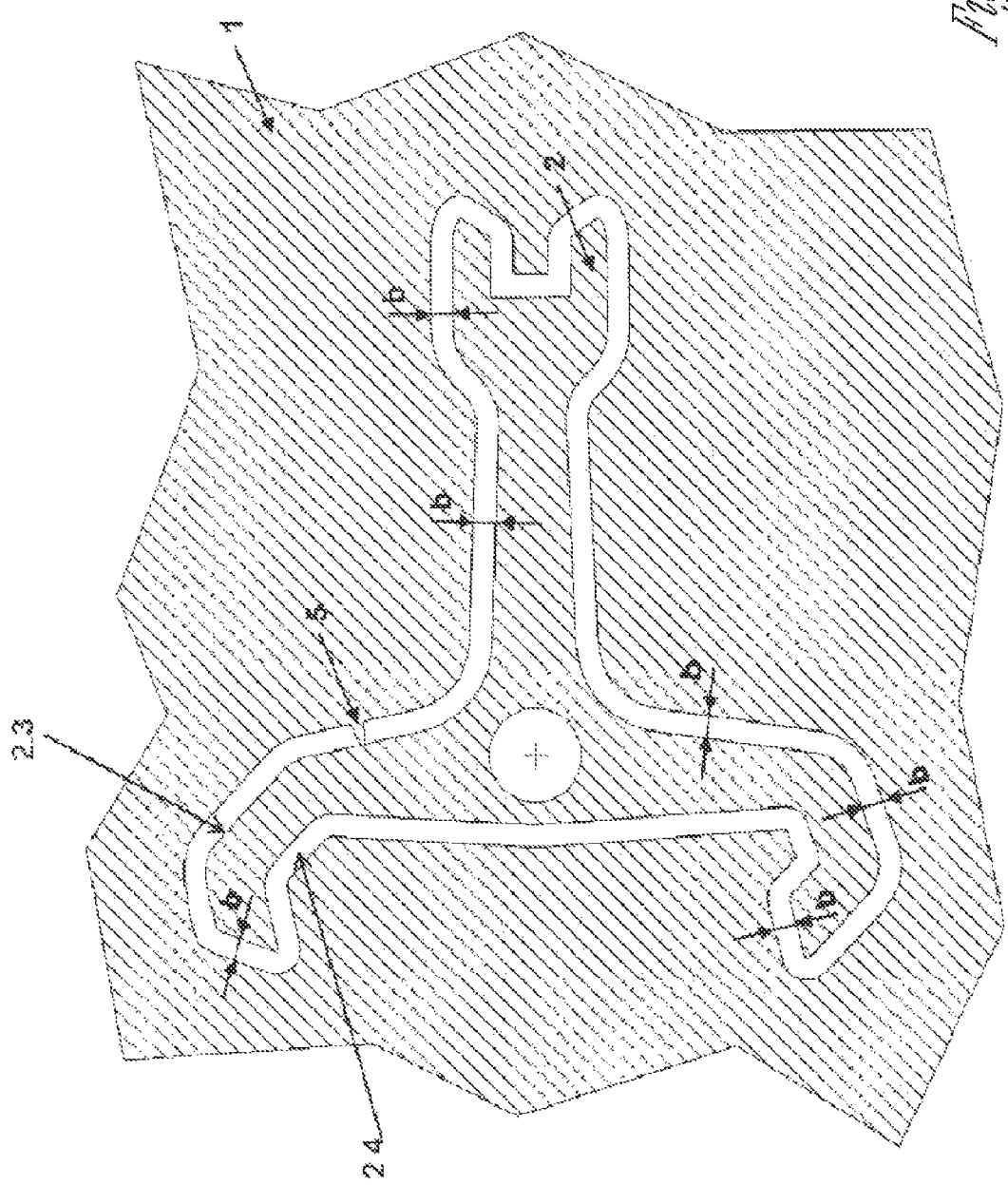

FIG. 7 shows a clock mechanism component in the form of an escapement, wherein FIG. 5 shows a component according to the prior art, i.e., a structuring in which a constant gap width b has been realized extending all the way around the escapement component 2, as is conventionally customary. The escapement is again held in the substrate material 1 by lands 5. The side faces are again identified as 2.3 and 2.4.

Figure 8:
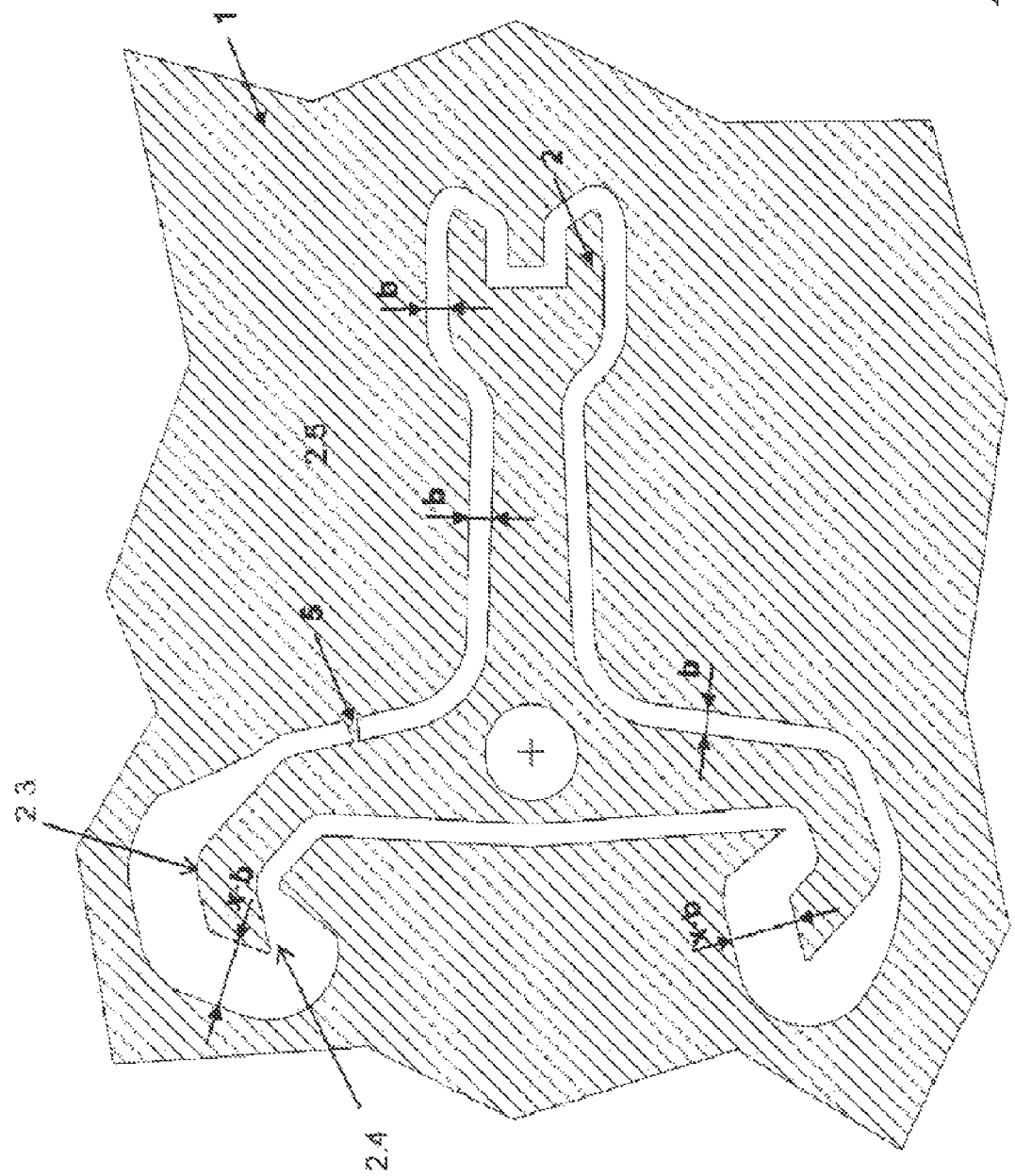
FIG. 8 shows a similar component according to the present subject matter with a varying gap width.

In contrast to this, FIG. 8 shows an embodiment according to the present subject matter of an escapement component of this type, which is characterized by the fact that in the area that is under high stress, a greater gap width b has been selected than has previously been the case in the prior art. In this manner, in the highly stressed area of the escapement component a coating thickness of the diamond coating that is at least twice as great as is customary in the prior art is achieved. At this point, it should be emphasized once again that because the reinforced area is located in only localized areas, specifically at those locations that are functionally connected to another component, costs are reduced, because the remaining coating thickness can be selected in a thin embodiment.

Figure 9:
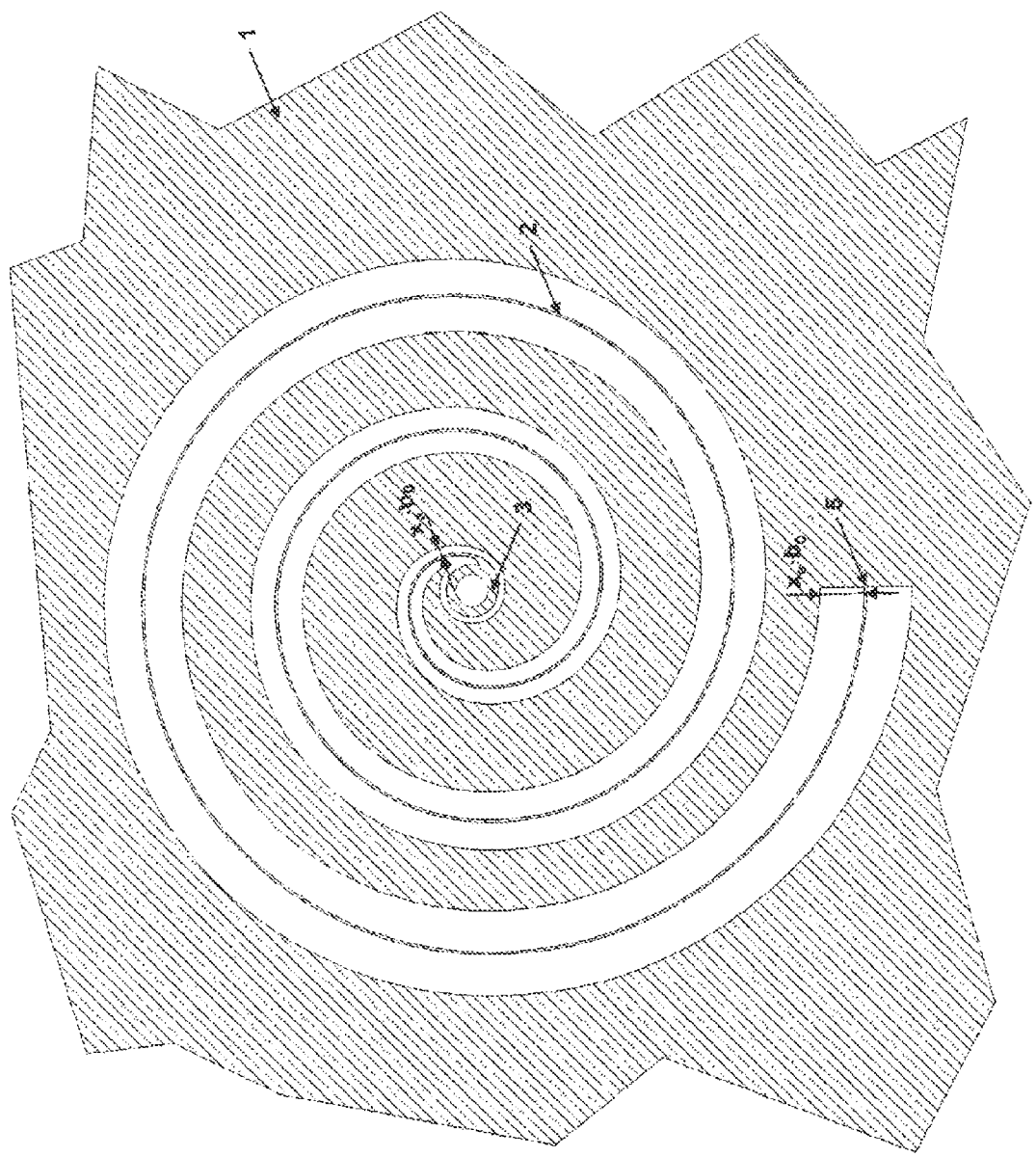
FIG. 9 shows a structured spring having different gap widths in a wafer.

FIG. 9 shows another example, specifically in the form of a watch spring 2. The watch spring 2 is again held by lands 5 in a silicon wafer, which functions as the substrate 1. As is clear from FIG. 9, the gap width b is selected such that this gap width widens continuously from the central center point 3 to the end point of the spring 5. In this manner, in contrast to the prior art, a spring is obtained which has optimum gear behavior as a result of the different coating thickness, which increases continuously up to the end point.

Of course, in addition to the gradual embodiment of the diamond coating thickness on the side faces, the spring leaf width of the silicon substrate can also be varied.

Figure 10:
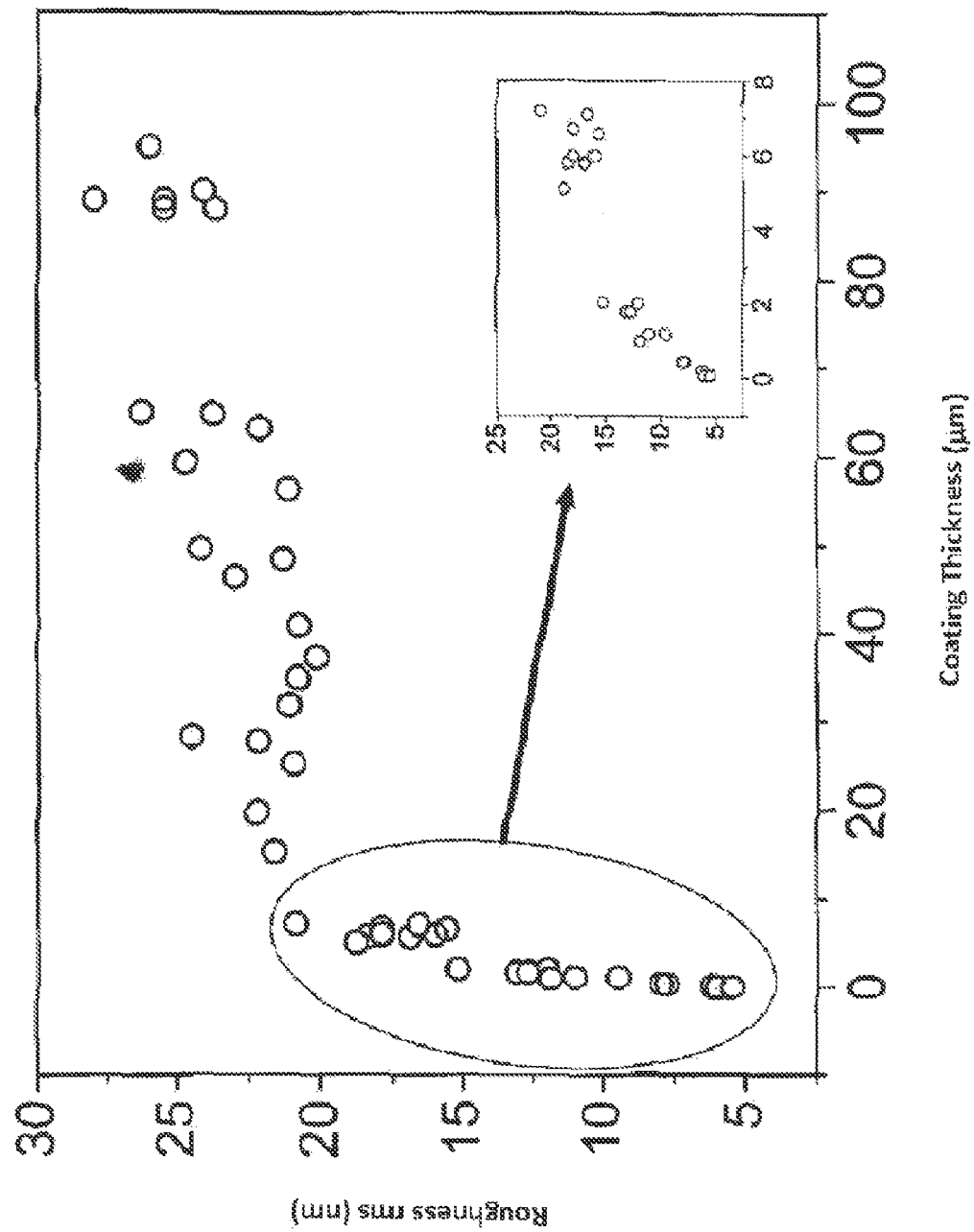
FIG. 10 illustrates the relationship between surface roughness and coating thickness.

FIG. 10 illustrates the correlation between roughness rms in nm and the coating thickness in μm. As the inventors have succeeded in demonstrating, coating thickness is correlated to roughness rms. Additional possibilities for optimizing the coating 6 further are opened up in that, due to the correlation as illustrated in FIG. 10, it is possible to modulate the coating 6 on the side face not only in such a way that a reinforced area is produced, but also such that one and the same surface is equipped with different roughness levels, depending upon the thickness. As FIG. 1 shows, surfaces having a very small coating thickness also have a very fine roughness, whereas surface areas that have an increased coating thickness also have a greater degree of roughness in rms. This therefore is another possibility for influencing the surface structure of the side faces, so that the component according to the present subject matter can be even further optimized in this manner.

What is claimed is:

1. A micromechanical component comprising:
    a top face and a bottom face;
    at least two side faces; and
    a coating comprising at least one of diamond and diamond-like carbon (DLC), the coating encompassing all surfaces of the component, wherein the coating is nanocrystalline and the gradient of the average grain size of the nanocrystalline diamond, measured in the direction of the thickness of the nanocrystalline diamond, is less than 300%;
    wherein the coating over at least a part of at least one side face has a smaller coating thickness than the coating of at least one of the top face and the bottom face, defining a reinforced area in relation to the at least one side face, wherein the coating thickness of the coating on at least one of the top face or the bottom face defines a minimum coating thickness between about 0.5 to about 50 micrometers, and the coating thickness of the at least one side face is at least 10% thinner relative to the minimum coating thickness of at least one of the top face and bottom face, wherein the coating thickness varies on the at least one side face;
    wherein the micromechanical component is made by a method comprising:
        (a) preparing a substrate plate comprising a substrate;
        (b) structuring the substrate by an etching step substantially orthogonally to the surface of the substrate plate, wherein a gap is formed, such that the width of the gap is varied along at least one side face of the substrate and wherein the width of the gap is narrowed over at least a part of the at least one side face to achieve a coating thickness at said part is at least 10% thinner than the coating thickness of at least one of the top face and the bottom face of the substrate, wherein the width of the gap is formed larger in an area to be reinforced than in other areas;
        (c) nucleating the substrate with carbon-containing educts to form diamond seeds; and
        (d) growing the diamond by at least one of a plasma process and a hot filament process.

2. The micromechanical component according to claim 1, wherein the reinforced area is formed at least on a part of the at least one side face that is configured to be brought into contact with another component or with an area of a component.

3. The micromechanical component according to claim 1, wherein the coating arranged on the at least one side face comprises a coating thickness profile having a concave shape.

4. The micromechanical component according to claim 1, wherein the coating thickness of the at least one side face, normalized to one or both of the top face and bottom face varies by at least 20%.

5. The micromechanical component according to claim 1, wherein the micromechanical component in cross-section has a quadrangular cross-section, with two side faces and one top face and one bottom face.

6. The micromechanical component according to claim 1, wherein the micromechanical component is adapted to be used as a clock mechanism component, and is at least one of a helical tension spring, an escapement, an escapement wheel, a restricting component, a plateau, a gear, a drive mechanism, a bearing pad, a cover pad, a journal pin, a shaft, an axle, a spring, a balance spring, and a balance wheel.

7. The micromechanical component according to claim 6 in the form of the helical tension spring, adapted to fit into a barrel of a clock mechanism having a predefined length (L), which extends from an inner end up to an outer end of the helical tension spring and has a rectangular cross-section, wherein the coating on the inner side or outer side has a greater coating thickness over at least a part of the length (L) of the helical tension spring.

8. The micromechanical component according to claim 1, wherein the substrate includes at least one of:
    a) at least one of a semi metal material carbon, silicon, and germanium;
    b) at least one of a metallic material, Fe, Ni, Cr, Co, Cu, Mn, V, Ti, Sc, W, Ta, Mo, Nb, Pt, Au, and Rh;
    c) at least one alloy of at least two of the metallic materials listed under b); and
    d) at least one of hard metal carbide.

9. The micromechanical component according to claim 1, wherein following step d) treating a surface of the component with plasma.

10. The micromechanical component according to claim 1, wherein ion etching is used as the etching step.

11. The micromechanical component according to claim 1, wherein a silicon wafer is used as the substrate plate.

12. The micromechanical component according to claim 1, wherein the micromechanical component structured from the substrate is held in the substrate by lands.

13. A micromechanical component comprising:
    a top face and a bottom face;
    at least two side faces; and
    a coating comprising at least one of diamond and diamond-like carbon (DLC), the coating encompassing the top face, the bottom face, and the at least two side faces, wherein the coating is nanocrystalline and the gradient of the average grain size of the nanocrystalline diamond, measured in the direction of the thickness of the nanocrystalline diamond, is less than 300%;
    wherein the coating over at least a part of at least one side face has a smaller coating thickness than at least one of the top face and the bottom face, defining a reinforced area in relation to the at least one side face, wherein the coating thickness of the coating on at least one of the top face or the bottom face defines a minimum coating thickness between about 0.5 to about 50 micrometers, and the coating thickness of the at least one side face is at least 10% thinner relative to the minimum coating thickness of at least one of the top face and bottom face and wherein the coating thickness varies on the at least one side face;
    wherein the micromechanical component is made by a method comprising:
        (a) preparing a substrate plate comprising a substrate;
        (b) structuring the substrate by an etching step substantially orthogonally to the surface of the substrate plate, wherein a gap is formed, such that the width of the gap is varied along at least one side face of the substrate and wherein the width of the gap is narrowed over at least a part of the at least one side face to achieve a coating thickness at said part which is at least 10% smaller than the coating thickness of at least one of the top face and the bottom face of the substrate, wherein the width of the gap is formed larger in an area to be reinforced than in other areas;

(c) nucleating the substrate with carbon-containing educts to form diamond seeds; and (d) growing the diamond by at least one of a plasma process and a hot filament process.

14. The micromechanical component according to claim 13, wherein the reinforced area is formed at least on that part of the at least one side face that is configured to be brought into contact with another component or with an area of a component.

15. The micromechanical component according to claim 13, wherein the coating arranged on the at least one side face comprises a concave shape.

16. The micromechanical component according to claim 13, wherein the coating thickness of the at least one side face, normalized to one or both of the top face and bottom face varies by at least 20%.

* * * * *